(12) United States Patent
Kuge

(10) Patent No.: US 6,212,492 B1
(45) Date of Patent: Apr. 3, 2001

(54) APPARATUS AND METHOD FOR CIRCUIT SIMULATION WHICH ACCOUNTS FOR PARASITIC ELEMENTS

(75) Inventor: Hiroyoshi Kuge, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/069,813

(22) Filed: Apr. 29, 1998

(51) Int. Cl.[7] .................................................. G06F 9/455
(52) U.S. Cl. .............................................................. 703/15
(58) Field of Search .................. 395/500.05, 500.06, 395/500.07, 500.09, 500.18, 500.35, 500.34, 500.4

(56) References Cited

U.S. PATENT DOCUMENTS 5,568,395 * 10/1996 Huang .............................. 395/500.05
5,666,288 * 9/1997 Jones et al. ...................... 395/500.18
5,764,533 * 6/1998 Dedood ........................... 395/500.09

* cited by examiner

Primary Examiner—Kevin J. Teska
Assistant Examiner—Dan Fiul
(74) Attorney, Agent, or Firm—Ostrolenk, Faber, Gerb & Soffen, LLP

(57) ABSTRACT

A simulation method of performing a circuit simulation by extracting resistances and capacitances from layout data of a circuit, on the basis of a positional relationship between transistors, well contact interconnections, and sub-contact interconnections of the layout data. Parasitic resistances and parasitic capacitances in conductive regions between sub-terminals of the transistors are evaluated. A simulation apparatus for performing a circuit simulation by extracting resistances and capacitances from layout data of a circuit is also disclosed.

4 Claims, 8 Drawing Sheets

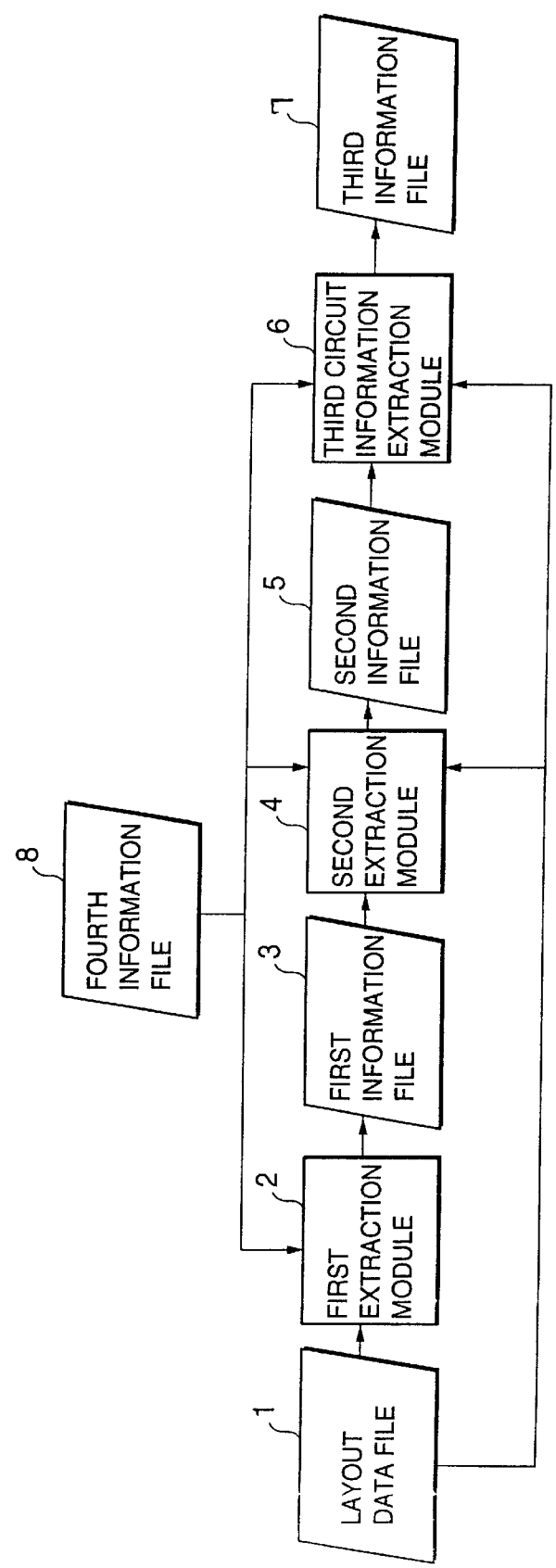

41

10

APPARATUS AND METHOD FOR CIRCUIT SIMULATION WHICH ACCOUNTS FOR PARASITIC ELEMENTS

BACKGROUND OF THE INVENTION

1. Field of the Invention

The present invention relates to a simulation method and apparatus for a circuit and, more particularly, to a circuit simulation method and apparatus for performing a circuit simulation by extracting resistances and capacitances from the layout data of a semiconductor integrated circuit.

2. Description of the Prior Art

An analog/digital hybrid circuit including a CMOS digital circuit such as a gate array, a cell base, or a microprocessor and an analog circuit is known. These circuits are integrated and commercially available as an LSI having a very high operating speed and a clock frequency of 200 MHz or more.

The characteristics of such a high-speed LSI cannot be satisfactorily evaluated by a circuit test at the time of circuit design. For this reason, layout data obtained after a layout process is used to extract interconnection resistive elements and interconnection capacitive elements included in signal interconnections and power supply interconnections, overlap capacitances which are physically present between the interconnections, capacitances between the adjacent interconnections, parasitic resistive/capacitive elements between device elements on the circuit, such as transistors, diodes, and resistive/capacitive elements between the interconnections, in addition to information about the device elements themselves. With this operation, circuit connection information including these parasitic elements is generated. A circuit simulation is performed by using this circuit data. In this manner, the circuit characteristics are evaluated at a level close to that for an actual circuit.

Conventionally, in most cases, such parasitic elements present in a circuit are extracted manually from a layout. Recently, however, with advances in automation of design by means of CAD tools, design can be performed at higher speeds as compared with manual design. In addition, automatic extraction has greatly improved extraction precision without artificial errors. Furthermore, with improvements in extraction models, for example, the capacitances between adjacent interconnections can be calculated with a high precision. This technique can therefore be satisfactorily applied to the most advanced process.

As described above, extraction of parasitic elements on a silicon substrate has attained a level at which no problem is posed in terms of speed and precision as compared with conventional manual extraction. However, parasitic elements present in a silicon substrate, e.g., the parasitic resistive/capacitive elements between the sub-terminals of MOS transistors and parasitic resistive/capacitive elements between well contact/sub-contact interconnections and the sub-terminals of the transistors, are still extracted roughly by a conventional manual extraction method.

With the recent decreases in element size and power supply voltage, the width of the operating voltage of each device element has reduced. For this reason, a circuit must be designed with sufficient consideration given to external noise. However, since almost no consideration is given to the influences of variations in transistor operation due to variations in voltage at the sub-terminal of each transistor which are caused by leakage of noise from a substrate, the influences of variations in the values of resistive and capacitive elements, and the influences of parasitic elements in the silicon substrate and well regions, these element greatly influence the circuit characteristics.

In addition, since clock synchronous circuits have become mainstream as digital LSIs, the influences of power supply voltage variations due to a clock operation on the sub-terminal of each transistor element on a circuit through well contact/sub-contact interconnections cannot be neglected either.

In a CMOS LSI including an analog circuit, a bias voltage is adjusted to compensate for reductions in Gm and drain current in each transistor, thereby realizing desired circuit characteristics. For this reason, a deterioration in performance of a silicon substrate or a well region due to parasitic elements becomes a factor that greatly influences the circuit characteristics.

An analog/digital hybrid LSI, in particular, exhibits a typical phenomenon in which noise from a digital portion leaks into an analog portion through a silicon substrate. For this reason, desired circuit characteristics cannot be apparently obtained.

To solve the above problems, modeling and extraction of parasitic elements in a silicon substrate and well regions and modeling and extraction of parasitic elements which are physically present between well contact/sub-contact interconnections and the sub-terminals of transistors must be accurately automated.

As described above, the problem of noise below the upper surface of a silicon substrate, which has become a noticeable factor that influences circuit characteristics with decreases in element size and power supply voltage, is scarcely solved because techniques of modeling and extracting parasitic elements associated with a silicon substrate and well regions have not been established. Since a circuit test is performed by rough manual estimation, a serious problem is posed in the future LSI design.

According to a conventional manual parasitic element estimation technique, a skilled designer estimates parasitic elements from information about the position of each element and element size information of the layout data of a circuit on the basis of his or her knowledge and the past know-how in design. The extraction precision therefore greatly depends on the experience and skill of the designer. In addition, as the circuit size increases, the number of steps in extraction increases, and artificial errors tend to occur.

In an analog circuit, even if the relative positions of transistors on a layout are spaced apart from each other, the transistors having high performance generate large amounts of noise and influence each other. To prevent this, certain distances are generally ensured between these elements. In this case, however, since noise is not quantitatively estimated, relative distances larger than the optimal inter-element distances are ensured. As a result, the layout size undesirably increases.

SUMMARY OF THE INVENTION

The present invention has been made in consideration of the above situation in the prior art, and has as its object to provide a simulation method and apparatus which performs a circuit simulation by accurately extracting parasitic elements produced in well regions and conductive regions in a substrate.

In order to achieve the above object, according to the first aspect of the present invention, there is provided a simulation method of performing a circuit simulation by extracting resistances and capacitances from layout data of a circuit, comprising the step of extracting the parasitic resistances and parasitic capacitances in conductive regions between sub-terminals of transistors on the basis of a positional relationship between the transistors, well contact interconnections, and sub-contact interconnections of the layout data.

According to the second aspect of the present invention, there is provided a simulation method of performing a circuit simulation by extracting resistances and capacitances from layout data of a semiconductor integrated circuit, comprising the steps of generating a first information file by looking up the layout data, generating a second information file including parasitic elements associated with interconnections by using the layout data and the first information file, and generating a third information file containing parasitic elements associated with the interconnections and below an upper surface of the substrate.

According to the third aspect of the present invention, there is provided a simulation apparatus for performing a circuit simulation by extracting resistances and capacitances from layout data of a circuit, comprising the step of extracting parasitic resistances and parasitic capacitances in conductive regions between sub-terminals of transistors on the basis of a positional relationship between the transistors, well contact interconnections, and sub-contact interconnections of the layout data.

According to the fourth aspect of the present invention, there is provided a simulation apparatus for performing a circuit simulation by extracting resistances and capacitances from layout data of a semiconductor integrated circuit, comprising a first extraction module for generating a first information file by looking up the layout data, a second extraction module for generating a second information file including parasitic elements associated with interconnections by using the layout data and the first information file, and a third extraction module for generating a third information file containing parasitic elements associated with the interconnections and below an upper surface of the substrate.

According to the fifth aspect of the present invention, there is provided a simulation apparatus for performing a circuit simulation by extracting resistances and capacitances from layout data of a semiconductor device, comprising a first information file, a first extraction module for extracting device elements included in the layout data on the basis of extraction rule information indicating a rule for extracting parasitic elements in a device substrate, and storing connection information between the device elements in the first information file, a second information file, a second extraction module for extracting resistive and capacitive elements of interconnections, capacitances between the interconnections, and parasitic capacitances between the interconnections and the device elements from the layout data on the basis of the layout data, the extraction rule information, and the connection information, and storing parasitic element information associated with the interconnections in the second information file, a third information file, and a third extraction module for extracting parasitic elements between sub-terminals of the device elements in the device substrate on the basis of the layout data, the extraction rule information, and the parasitic element information, and storing, in the third information file, rule information about extraction of parasitic elements associated with the interconnection and extraction of parasitic elements below an upper surface of the device substrate.

As is obvious from the above aspects, according to the present invention, parasitic elements between the sub-terminals of transistors and between sub-terminals, well contact interconnections, and sub-contact interconnections, can be generated by extracting from layout data parasitic elements in well regions below the upper surface of a silicon substrate and conductive regions. Therefore, a quantitative test on circuit characteristics influenced by noise leakage through a silicon substrate can be performed. Such circuit characteristics cannot be evaluated in the prior art. In addition, a phenomenon in which a circuit operation greatly influences variations in power supply voltage as the range of a transistor operating voltage reduces with decreases in element size and power supply voltage can be accurately evaluated by analyzing variations in sub-terminal potential. Furthermore, a layout size can be optimized by optimizing the arrangement of transistors in consideration of the propagation of noise produced between transistors. As described above, since electrical characteristics below the upper surface of a silicon substrate can be evaluated unlike in the prior art, the present invention has great effects.

The above and many other objects, features and advantages of the present invention will become manifest to those skilled in the art upon making reference to the following detailed description and accompanying drawings in which preferred embodiments incorporating the principles of the present invention are shown by way of illustrative examples.

BRIEF DESCRIPTION OF THE DRAWINGS

FIG. 1 is a block diagram for explaining a simulation apparatus according to an embodiment of the present invention;

DETAILED DESCRIPTION OF THE PREFERRED EMBODIMENTS

Figure 2A:
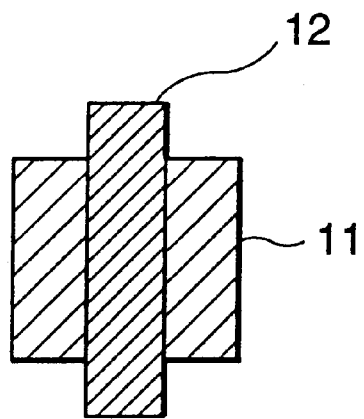
FIGS. 2A and 2B are a schematic view and an equivalent circuit diagram, respectively, showing a transistor extracted by a first extraction module included in the simulation apparatus in FIG. 1.

Several preferred embodiments of the present invention will be described below with reference to the accompanying drawings.

FIG. 1 is a block diagram for explaining a simulation apparatus according to an embodiment of the present invention. The simulation apparatus described below includes a parasitic element extraction unit for extracting parasitic elements in the transistor connection of an LSI through a substrate from the layout data of the semiconductor device.

The layout data is generated manually or by an automatic layout tool in accordance with circuit connection information for implementing a desired circuit operation. A layout data file 1 contains, as layout data, device element information, interconnection information for connecting device elements to each other, and information about well contact interconnections and sub-contact interconnections between the sub-terminals of transistor elements.

A circuit information extraction module (first extraction module) 2 is connected to the layout data file 1 and a device element/parasitic element extraction rule information file (fourth information file) 8 to extract information about the device elements included in the layout and information about connections between the respective device elements in accordance with inputs from these files.

A circuit connection information file (first information file) 3 is connected to the first extraction module 2 to file the extraction result obtained by the first extraction module 2. More specifically, the first information file 3 contains electrical characteristic values such as the sizes, resistances, and capacitances of the device elements in the layout and information about the connections between the respective device elements.

An interconnection parasitic element/interconnection-device parasitic element extraction module (second extraction module) 4 is connected to the layout data file 1, the first extraction module 2, and the fourth information file 8 to extract interconnection resistive elements on the interconnections connecting the device elements to each other, the interconnection capacitive elements between the substrate and the interconnections, the overlap capacitive elements and side-surface capacitive elements between the interconnections, the capacitive elements between the adjacent interconnections, and the parasitic capacitive elements between the interconnections and the device elements. The extractions are performed in accordance with inputs from the first information file 3, the layout data file 1, and the fourth information file 8.

A circuit connection information file (second information file) 5 is connected to the second extraction module 4 to file the extraction result obtained by the second extraction module 4, including the parasitic elements associated with the interconnections.

A parasitic element extraction module (third circuit information extraction module) 6 for parasitic elements below the upper surface of the silicon substrate is connected to the layout data file 1, the second information file 5, and the fourth information file 8 to extract the parasitic elements between the sub-terminals of the device elements connected to each other through well regions below the upper surface of the silicon substrate and conductive regions in the substrate in accordance with inputs from the second information file 5, the layout data file 1, and the fourth information file 8.

A circuit connection information file (third information file) 7 is connected to the third circuit information extraction module 6 to file the extraction result obtained by the third circuit information extraction module 6, including the parasitic elements associated with the interconnections and those existing below the upper surface of the silicon substrate. More specifically, the third information file 7 contains the parasitic elements between the sub-terminals of the devices connected to each other through the well regions below the upper surface of the substrate and the conductive regions.

The fourth information file 8 files input data to be input to the first extraction module 2, the second extraction module 4, and the third circuit information extraction module 6. More specifically, the fourth information file 8 contains all mask layer information such as the layer numbers of layout masks in the layout data file 1, interconnection mask layer numbers, and well mask layers. The fourth information file 8 also contains information about combinations of mask layers constituting transistors, resistive/capacitive elements, and the like, which is required by the first extraction module 2. The fourth information file 8 also includes process information such as resistances, capacitances, and the like per unit length and unit area associated with conductive layers for interconnections, well regions, and the like, and control parameters (mesh sizes) used to calculate the characteristic values of parasitic elements, which is required by the second extraction module 4 and the third circuit information extraction module 6.

Figure 2B:
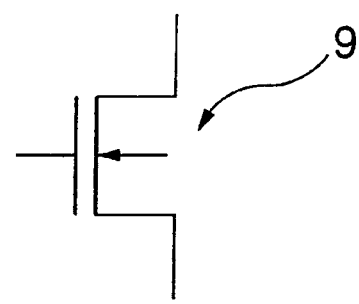

As shown in FIGS. 2A and 2B, the first extraction module 2 recognizes the overlap portion (AND processing for rectangles) between an NMOS diffusion mask rectangle 11 and an NMOS polysilicon gate mask rectangle 12 as the gate electrode portion of an NMOS transistor 9; and the remaining NMOS diffusion rectangle portions (NOT processing for rectangles), as the source and drain electrodes of the transistor, thereby generating NMOS transistor information.

Figure 3A:
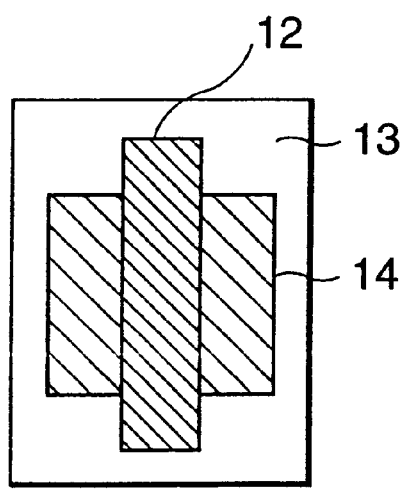
FIGS. 3A and 3B are a schematic view and an equivalent circuit diagram, respectively, showing another transistor extracted by the first extraction module included in the simulation apparatus in FIG. 1.
Figure 3B:
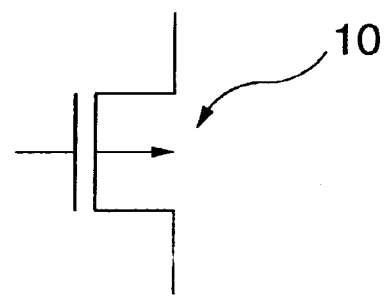

As shown in FIGS. 3A and 3B, the first extraction module 2 also recognizes the overlap portion (AND processing for rectangles) between an N-well region mask rectangle 13, a PMOS diffusion mask rectangle 14, and the NMOS polysilicon gate mask rectangle 12 as the gate electrode of a PMOS transistor 10; the PMOS diffusion mask portions other than the gate electrode portion (NOT processing for rectangles), as the source and drain electrodes of the PMOS transistor 10; and the N-type well region portion (NOT processing) other than the gate electrode and the PMOS diffusion mask, as the sub-terminal electrode portion of the PMOS transistor 10, thereby generating PMOS transistor information. The first extraction module 2 generates device element information such as transistor information by performing arithmetic processing between layout masks in this manner.

Figures 4A, 4B:
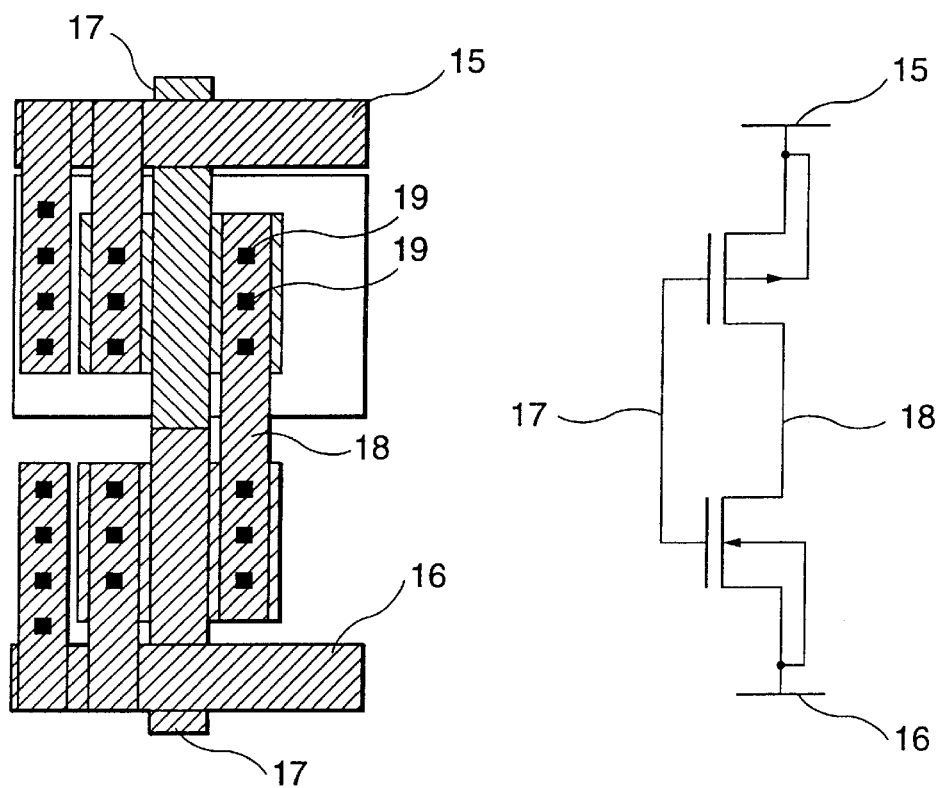
FIGS. 4A and 4B are a schematic view and an equivalent circuit diagram, respectively, showing an example of inter-transistor connection information extracted by the first extraction module included in the simulation apparatus in FIG. 1.

Furthermore, as shown in FIGS. 4A and 4B, the first extraction module 2 performs arithmetic processing for overlap between the device elements recognized in FIGS. 2A to 3. As shown in FIGS. 4A and 4B, first extraction module 2 recognizes a power supply interconnection (VDD) mask rectangle 15, a power supply interconnection (GND) mask rectangle 16, a signal interconnection (input) mask rectangle 17, a signal interconnection (output) mask rectangle 18, and a contact mask rectangle and overlap between gate mask rectangles, and performs electric equipotential tracking processing, thereby generating information about the connection between the transistors. The first extraction module 2 performs arithmetic processing, equipotential tracking processing, and the like for mask rectangles to generate the first information file 3.

Figure 5:
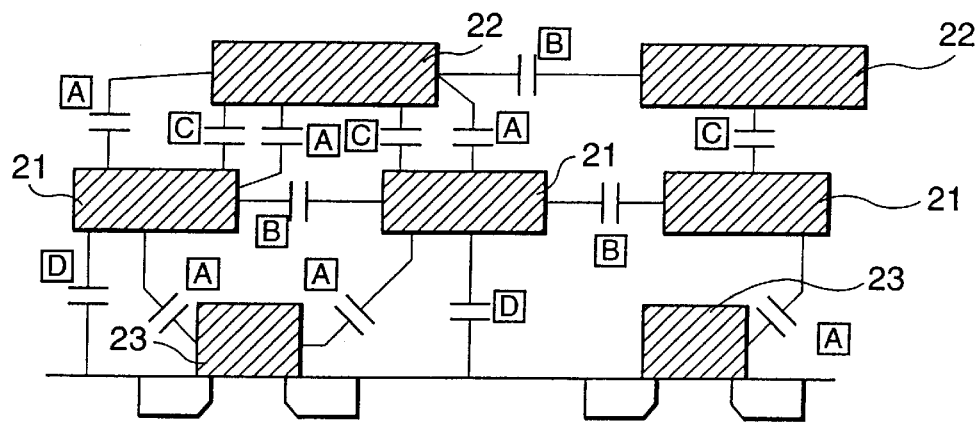
FIG. 5 is a schematic view showing an example of information about interconnection parasitic capacitances, parasitic capacitances between interconnections, and parasitic capacitances between the interconnections and devices, which is extracted by a second extraction module included in the simulation apparatus in FIG. 1.

As shown in FIG. 5, the second extraction module 4 extracts parasitic capacitive elements such as layer-to-substrate capacitances D between the silicon substrate and first interconnection layers 21 formed between transistor and interconnection regions on the silicon substrate, side-surface capacitances A between the first interconnection layers 21 and transistor gates 23, capacitances B between the adjacent first interconnection layers 21, overlap capacitances C between the first interconnection layers 21 and second interconnection layers 22, capacitances D with respect to the substrate, and capacitances B between the adjacent second interconnection layers 22. In extracting these pieces of parasitic capacitance information, the second extraction module 4 calculates parasitic capacitances on the basis of the rectangle arithmetic processing results obtained by performing AND processing, NOT processing, ENCLOSURE processing, EXTERNAL processing, and the like with respect to the transistor gate mask rectangles and the first and second interconnection layer mask rectangles, and the capacitances per unit circumferential length and unit area stored in the fourth information file 8.

Figure 6:
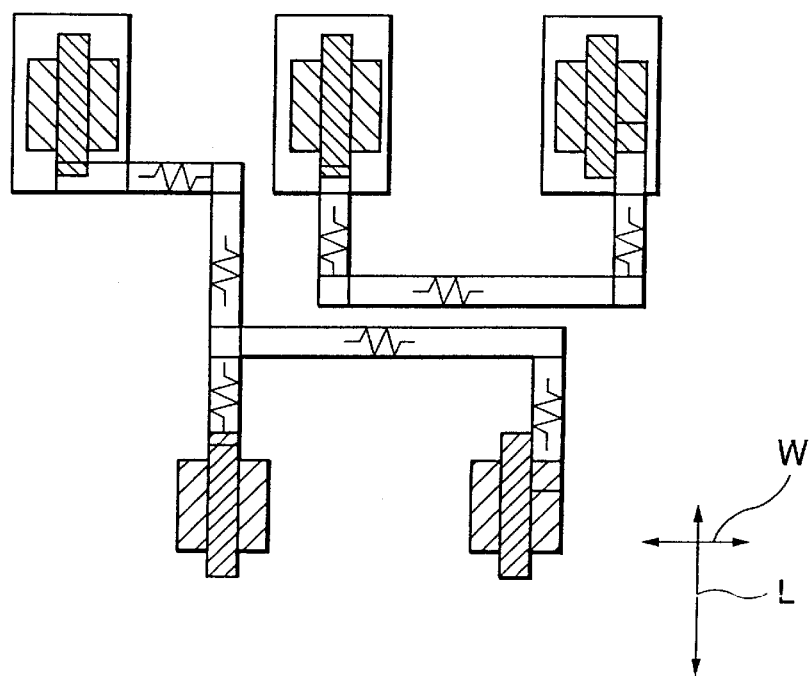
FIG. 6 is a schematic view showing an example of information about interconnection resistances, which is extracted by the second extraction module included in the simulation apparatus in FIG. 1.

In addition, as shown in FIG. 6, the second extraction module 4 also calculates interconnection rectangle widths (in the direction indicated by an arrow W) and interconnection rectangle lengths (in the direction indicated by an arrow L) in units of interconnection layer mask rectangles connecting the transistors to each other, and then calculates interconnection resistances on the basis of the sheet resistance of each interconnection layer stored in the fourth information file 8 according to the following equation:

interconnection resistance=sheet resistance×interconnection rectangle length÷interconnection rectangle width The second extraction module 4 performs the processing shown in FIGS. 5 and 6 in this manner to extract the parasitic capacitive elements between the interconnections and the device elements and the parasitic resistive elements and parasitic capacitive elements between the interconnections. The second extraction module 4 then maps the parasitic element information to the first information file 3 and generates the second information file 5 containing the parasitic elements associated with the interconnections.

Figure 7A:
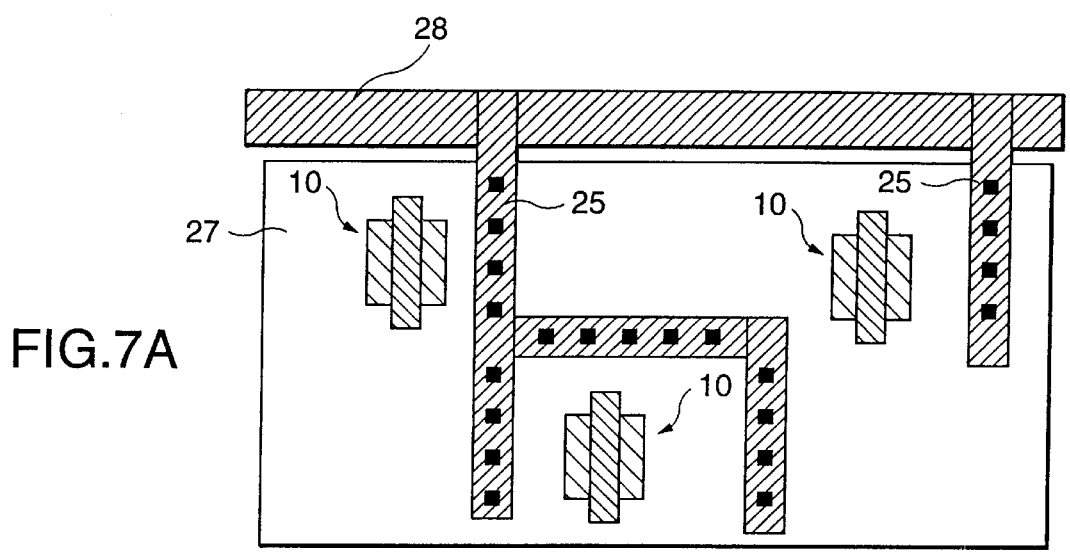
FIGS. 7A and 7B are views showing an object to be extracted by a third extraction module included in the simulation apparatus in FIG. 1 and a layout.
Figure 7B:
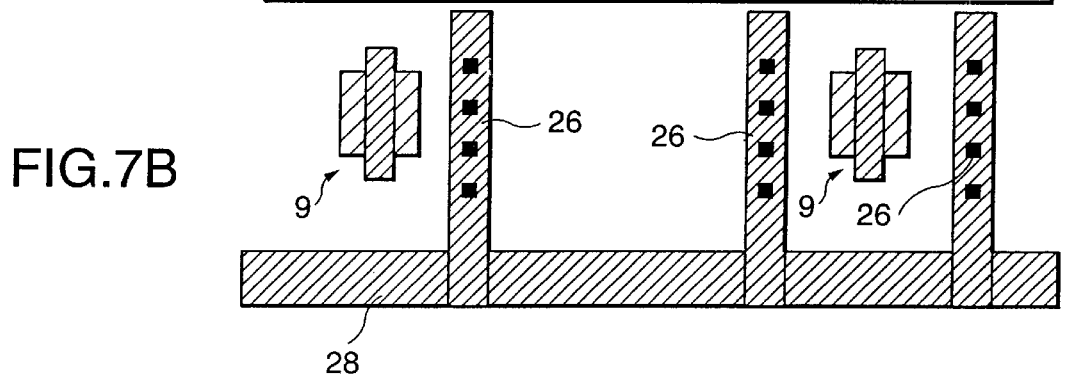

As shown in FIGS. 7A and 7B, the third circuit information extraction module 6 extracts the parasitic elements between the sub-terminals of the transistor elements on the basis of information about the device regions such as transistor regions, the well contacts, well contact interconnections 25, the sub-contacts, and sub-contact interconnection 26 on the silicon substrate. Third circuit information extraction module 6 also extracts information about well regions 27 below the upper surface of the silicon substrate, and information about conductive regions 28 in the substrate.

Figure 8A:
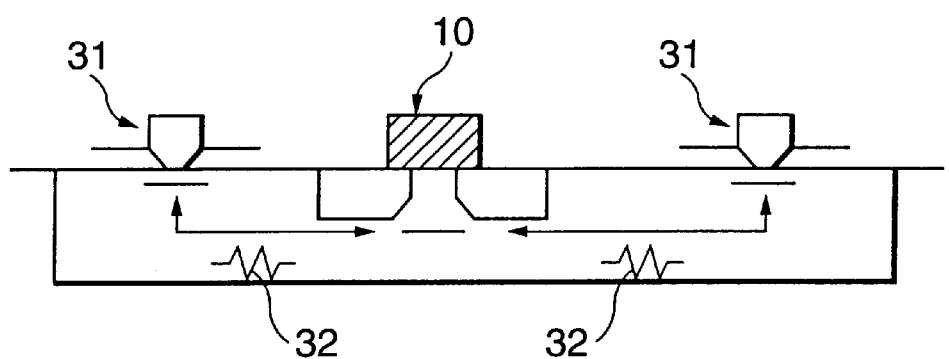
FIGS. 8A and 8B are sectional views respectively showing examples of pieces of information about parasitic resistive elements extracted by the third extraction module included in the simulation apparatus in FIG. 1 and layouts.
Figure 8B:
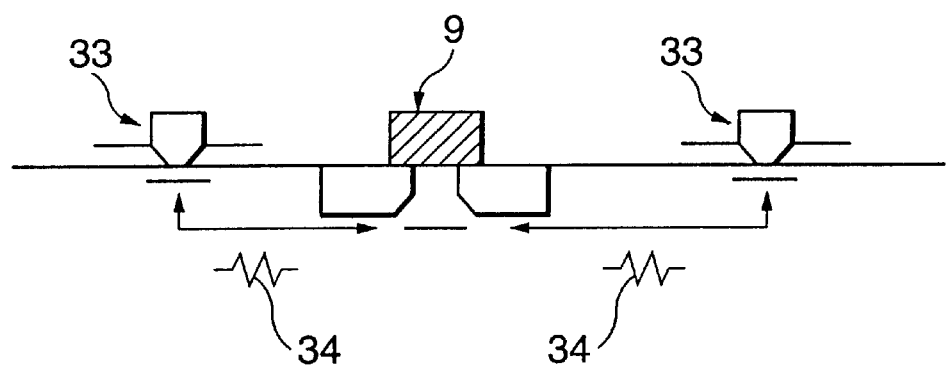

FIGS. 8A and 8B are sectional views of LSIs. More specifically, FIGS. 8A and 8B schematically show parasitic resistive elements 32 in the well regions between the sub-terminal electrode portions below the PMOS transistor 10 and well contact interconnection 31 portions. Moreover, parasitic resistive elements 34 exist in the conductive regions between the sub-terminal electrode portions below the NMOS transistor 9 and sub-contact interconnection 33 portions.

Figure 9A:
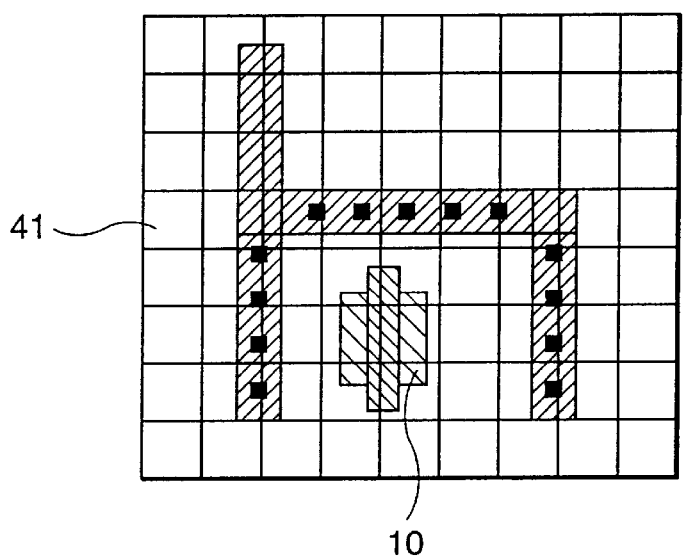
FIGS. 9A and 9B are a schematic view and a partial enlarged view, respectively, for explaining a method by which the third extraction module included in the simulation apparatus in FIG. 1 extracts parasitic element information.
Figure 9B:
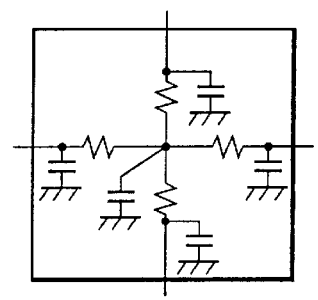

FIGS. 9A and 9B show a method by which the third circuit information extraction module 6 extracts the parasitic elements between a well region 41 and well contact interconnections including the PMOS transistor 10. More specifically, as shown in FIG. 9A, the third circuit information extraction module 6 divides the well region 41 into meshes on the basis of the division mesh size stored in the fourth information file 8, and calculates resistances and capacitances in the respective divided rectangular regions on the basis of the sheet resistances in the well regions and capacitance information per unit area, which are stored in the fourth information file 8, according to the above equation. The third circuit information extraction module 6 then generates a network of parasitic elements on the basis of the parasitic resistive and capacitive elements in each rectangular region, as indicated by the enlarged view of the rectangular region of FIG. 9B. The third circuit information extraction module 6 performs the same processing as described above with respect to all the divided rectangular regions to generate circuit connection information of the parasitic elements in the well regions.

Figure 10:
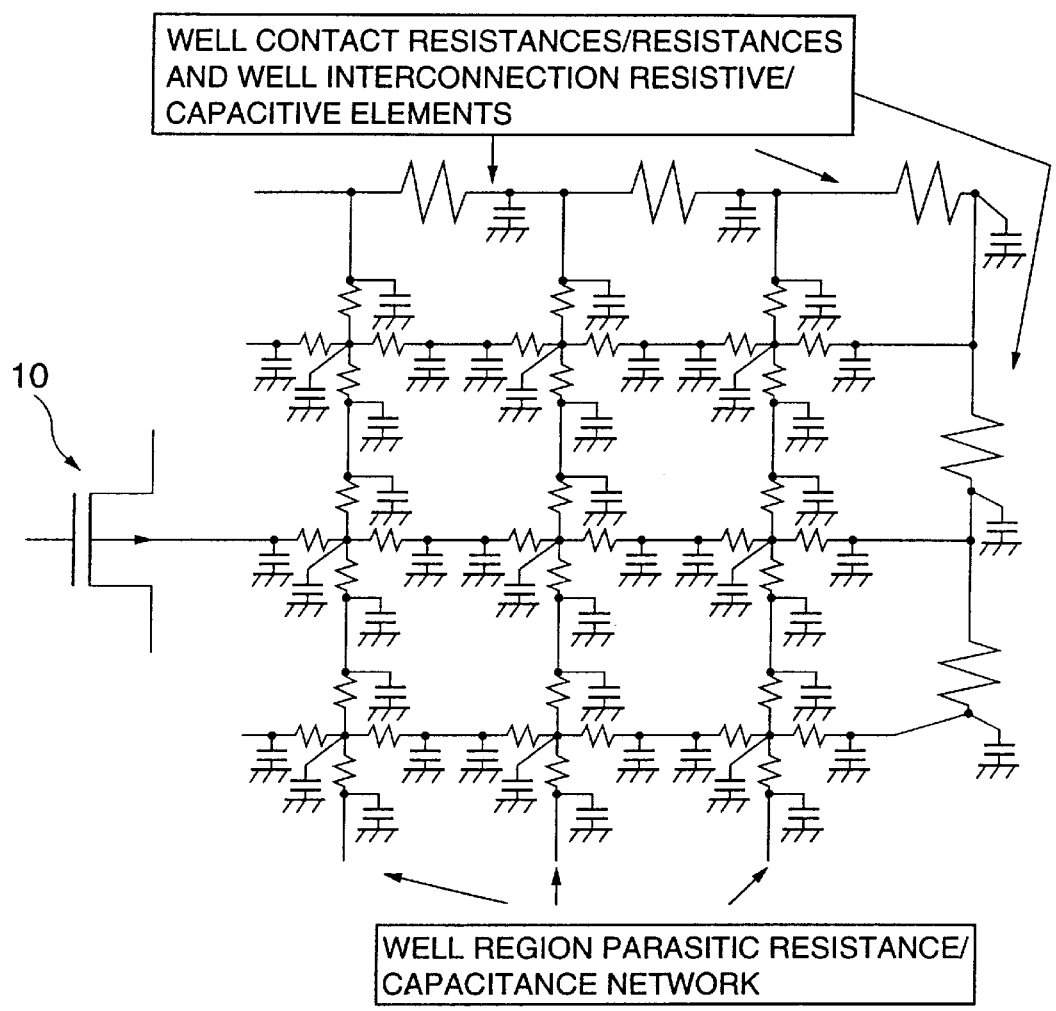
FIG. 10 is a view showing a detailed layout-like image of circuit connection information about a parasitic element extraction result obtained by the third extraction module included in the simulation apparatus in FIG. 1.

FIG. 10 shows a parasitic element network extracted from the well regions in FIG. 9A by the third circuit information extraction module 6. That is, FIG. 10 shows a circuit network obtained by connecting the sub-terminal of the PMOS transistor to the link of the network of the parasitic resistive/capacitive elements extracted from the respective rectangular regions obtained by dividing the layout (FIGS. 9A and 9B) into meshes, and linking the well contact resistances/capacitances to well contact interconnection resistive/capacitive elements. The connection between the sub-terminal of the PMOS transistor and the network of the parasitic resistances/capacitances in the well regions, which is generated by the third circuit information extraction module 6, is linked to the central node in the mesh rectangle corresponding to the center of gravity of the PMOS transistor region. In addition, in connecting the network of the parasitic resistances/capacitances in the well regions to the well contact resistance/capacitance and well interconnection resistance/capacitance network, each well contact is linked to the rectangular parasitic resistance/capacitance network included in each divided rectangular region in FIG. 9A. In this manner, the third circuit information extraction module 6 extracts parasitic element networks in the well regions below the upper surface of the silicon substrate and in the conductive regions, and links parasitic element connection information about the connection between the transistors, the interconnections, and between the interconnections on the silicon substrate, and between the interconnections and the devices, which are generated in advance and stored in the second information file 5, thereby generating the third information file 7.

What is claimed is:

1. A method of simulating a circuit, said method comprising:
    receiving layout data of said circuit, said layout data including well contact interconnections, and sub-contact interconnections of circuit elements in said circuit; and
    determining parasitic resistances and parasitic capacitances in conductive regions between sub-terminals of transistors in said circuit on the basis of positional relationships of said transistors, said well contact interconnections and said sub-contact interconnections in said circuit.

2. An apparatus for performing circuit simulation, said apparatus comprising:

an input circuit which receives layout data of said circuit; and a processor which determines parasitic resistances and parasitic capacitances in conductive regions between sub-terminals of transistors on the basis of positional relationships of said transistors, said well contact interconnections and said sub-contact interconnections in said circuit.

3. The method as claimed in claim 1 wherein said determining comprises:

dividing a well region into meshes on the basis of a division mesh size;

calculating mesh parasitic elements in each mesh; and generating a network of simulated parasitic elements which correspond to said mesh parasitic elements.

4. The apparatus as claimed in claim 2 wherein said processor, in performing said determining, further:

divides a well region into meshes on the basis of a division mesh size;

calculates mesh parasitic elements in each mesh; and generates a network of simulated parasitic elements which correspond to said mesh parasitic elements.

\* \* \* \* \*